United States Patent
Chiang et al.

(12)

(10) Patent No.: US 6,235,600 B1
(45) Date of Patent: May 22, 2001

(54) METHOD FOR IMPROVING HOT CARRIER LIFETIME VIA A NITROGEN IMPLANTATION PROCEDURE PERFORMED BEFORE OR AFTER A TEOS LINER DEPOSITION

(75) Inventors: Mu-Chi Chiang; Hsien-Chin Lin; Jiaw-Ren Shih, all of Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/531,403

(22) Filed: Mar. 20, 2000

(51) Int. Cl.$^7$ .................................................. H01L 21/336
(52) U.S. Cl. ...................... 438/305; 438/306; 438/307; 438/515
(58) Field of Search ...................... 438/299, 306, 438/305, 307, 515, 516

(56) References Cited

U.S. PATENT DOCUMENTS

| 5,885,877 | 3/1999 | Gardner et al. | 438/300 |
| 5,920,782 | 7/1999 | Shih et al. | 438/303 |
| 5,972,783 | 10/1999 | Arai et al. | 438/513 |
| 5,994,175 | 11/1999 | Gardner et al. | 438/199 |

*Primary Examiner*—Long Pham
(74) *Attorney, Agent, or Firm*—George O. Saile; Stephen B. Ackerman

(57) ABSTRACT

A process for fabricating input/output, N channel, (I/O NMOS) devices, featuring an ion implanted nitrogen region, used to reduce hot carrier electron, (HEC), injection, has been developed. The process features implanting a nitorgen region, at the interface of an overlying silicon oxide layer, and an underlying lightly doped source/drain, (LDD), region. The implantation procedure can either be performed prior to, or after, the deposition of a silicon oxide liner layer, in both cases resulting in a desired nitrogen pile-up at the oxide-LDD interface, as well as resulting, in a more graded LDD profile. An increase in the time to fail, in regards to HCE injection, for these I/O NMOS devices, is realized, when compared to counterparts fabricated without the nitrogen implantation procedure.

23 Claims, 4 Drawing Sheets

METHOD FOR IMPROVING HOT CARRIER LIFETIME VIA A NITROGEN IMPLANTATION PROCEDURE PERFORMED BEFORE OR AFTER A TEOS LINER DEPOSITION

BACKGROUND OF THE INVENTION (1) Field of the Invention

The present invention relates to methods used to fabricate semiconductor devices, and more specifically to an ion implantation procedure, used to improve the reliability of metal oxide semiconductor field effect transistor, (MOSFET), devices, in regards to a hot electron carrier phenomena.

(2) Description of Prior Art

Micro-miniaturization has allowed the semiconductor industry to fabricate MOSFET devices with sub-quarter micron features. Specific MOSFET devices, such as input/output, N channel, (I/O NMOS), devices, used for logic applications, can however be prone to a hot electron carrier, (HCE), reliabiltty phenomena. The I/O NMOS devices, operating at a voltage of 3.3, or 2.5 volts, can suffer gate insulator degradation, as a result of hot electron injection at these operating voltages. The substrate current, or drain current specifications are therefore difficult to satisfy, as a result of the HCE phenomena, for sub-quarter micron, I/O NMOS devices, operating at 3.3, or 2.5 volts. Methods of anmealing the gate insulator layer, in an NO or $N_2O$ ambient, have not resulted in reductions in substrate current, (Isub), while other methods such as only providing a more graded, lightly doped source/drain, (LDD), region, have also not delivered the improved reliability of I/O NMOS devices, regarding HCE injection.

This invention will describe a novel process used to alleviate HCE injection, entailing the implantation of nitrogen, ($N_2$), or nitrogen ions, ($N^+$), either prior to, or after deposition of a silicon oxide layer, obtained using tetraethylorthosilicate, (TEOS), as a source, with the TEOS layer used as a liner layer, prior to formation of composite insulator spacers. The nitrogen implantation, located adjacent to the gate structure, and at the interface of a silicon oxide layer, underlying the composite insulator spacer, and an underlying lightly doped source/drain region, reduces HCE injection, as a result of nitrogen pile-up, at this interface. In addition the unplantation procedure allows an increase in transient enhanced diffusion, (TED), to occur, resulting in a greater degree of LDD grading, than offered by counterparts fabricated without this nitrogen implant, thus reducing Isub, indicating a reduction of HCE injection. Prior art, such as Gardner et al, in U.S. Pat. No. 5,994,175, as well as Arai et al, in U.S. Pat. No. 5,972,783, describe nitrogen implantation prior to LDD formation, not however describing this present invention of implanting nitrogen, post LDD implantation, performed either prior to, or after deposition of a TEOS liner, used underlying a subsequent composite insulator layer.

SUMMARY OF THE INVENTION

It is an object of this invention to improve the reliability of sub-quarter micron, I/O NMOS devices, operating at 3.3 and at 2.5 volts, via reducing HCE injection.

It is another object of this invention to implant nitrogen, or nitrogen ions, near the top surface of the LDD region, prior to, or after, deposition of a TEOS oxide layer, to be used a TEOS liner, underlying a subsequently formed composite insulator sidewall spacer.

It is still another object of this invention to ion implant the LDD dopants, than in situ implant nitrogen, prior to, or after, deposition of the TEOS liner.

In accordance with the present invention, a method of implanting nitrogen, near the top surface of an LDD region, prior to, or after deposition of a TEOS liner, is described. A first iteration of this invention entails forming a polysilicon gate structure, on an underlying silicon dioxide gate insulator layer, and after an polysilicon re-oxidation step, a photoresist shape is used to block MOSFET core devices from an implantation procedure used to create an LDD region for I/O NMOS devices. After deposition of a silicon oxide layer, using TEOS as a source, another photoresist shape is again used to block core MOSFET devices, from a $N_2$ or a $N^+$ implantation procedure, placing the implanted species at a silicon oxide layer—LDD interface, for the I/O NMOS devices. Deposition of a silicon oxide layer, and of a silicon nitride layer, are followed by an anisotropic reactive ion etching, (RIE), procedure, resulting in a composite insulator spacer, overlying the TEOS liner, and on the sides of the I/O NMOS polysilicon gate structure, and overlying the nitrogen implanted, LDD region.

A second iteration of this invention uses only one photoresist shape, to block the MOSFET core devices, from a series of in situ ion implantation procedures, comprising the implant procedure used to form the I/O NMOS, LDD region, followed by the in situ nitrogen implant. These implantations can be performed prior to, or after deposition of the TEOS liner.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
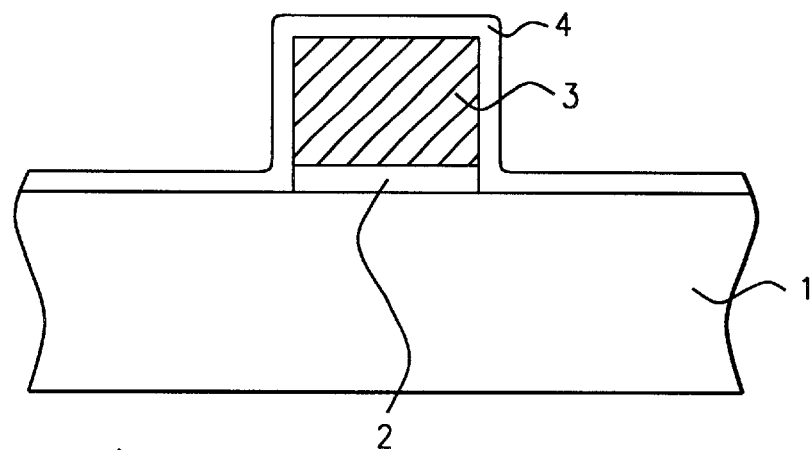
FIGS. 1–5, which schematically, in cross-sectional style, describe a first iteration of this invention, featuring the use of nitrogen, implanted into a top surface of a I/O NMOS, LDD region, after deposition of a TEOS liner layer.

The method of fabricating an I/O NMOS MOSFET device, with improved reliability, in terms of HCE injection, via a nitrogen implantation procedure, performed prior to, or after, the deposition of a TEOS silicon oxide layer, used between an underlying LDD region, and an overlying composite insulator spacer, will now be described in detail. A P type, semiconductor substrate 1, comprised of single crystalline silicon, with a <100> crystallographic orientation, is used and schematically shown in FIG. 1. A gate insulator layer 2, comprised of silicon dioxide, at a thickness between about 40 to 80 Angstroms, is thermally grown in an oxygen—steam ambient, at a temperature between about 650 to 900° C. A polysilicon layer is next deposited via low pressure chemical vapor deposition, (LPCVD), procedures, at a thickness between about 1500 to 2500 Angstroms. The polysilicon layer is either doped in situ, during deposition, via the addition of arsine, or phosphine, to a silane ambient, or the polysilicon layer is deposited intrinsically then doped via implantation of arsenic, or phosphorous ions. Conventional photolithographic and anisotropic, reactive ion etching, (RIE), procedures, using $Cl_2$ or $SF_6$ as an etchant are used to define polysilicon gate structure 3, schematically shown in FIG. 1. The photoresist shape used to define polysilicon gate structure 3, is removed via plasma oxygen ashing and carefuil wet cleans, with the wet clean cycle removing the exposed regions of gate insulator 2, not covered by polysilicon gate structure 3. An oxidation procedure is next performed to form silicon oxide layer 4, on the surface of polysilicon gate structure 3, as well as on the exposed surface of semiconductor substrate 1. Silicon oxide layer 4, at a thickness between about 15 to 80 Angstroms, is obtained via thermal oxidation procedures, at a temperature between about 800 to 1015° C., in an oxygen-steam ambient.

Figure 2:
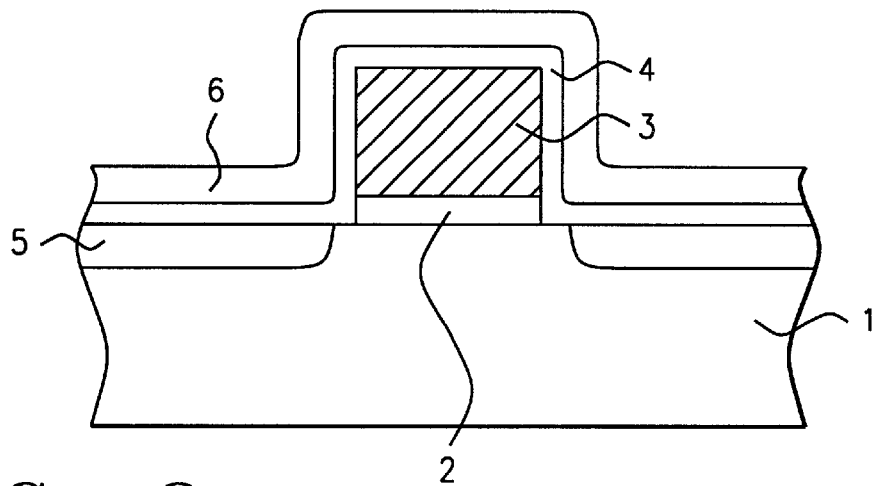

A first iteration of this invention is next described, and shown schematically in FIGS. 2–5. In addition to the fabrication of the I/O NMOS devices, the fabrication of core devices are also integrated on the same semiconductor chip. The core devices, not shown in the drawings, are designed with performance and reliability parameters, different than the performance and reliability requirements of the I/O NMOS devices. Therefore specific regions of the core devices, such as a previously formed lightly doped source/drain region, (LDD), have to be protected from subsequent I/O NMOS process steps, such as formation of the I/O NMOS LDD regions, and the critical nitrogen implantation procedure. Therefore prior to the formation of the I/O NMOS, LDD region 5, a photoresist block out shape, not shown in the drawings, is use to protect the core devices. LDD region 5, shown schematically in FIG. 2, is formed via ion implantation of arsenic or phosphorous ions, at an energy between about 20 to 50 KeV, at a dose between about 2E13 to 5E13 atoms/cm$^2$. This ion implantation procedure can be performed at an angle between about 0 to 45 degrees. After removal of the photoresist shape used to protect the core devices from implantation procedures used to form LDD region 5, via plasma oxygen ashing and careful wet cleans, TEOS liner 6, is deposited via LPCVD, or via plasma enhanced chemical vapor deposition, (PECVD), procedures, at a temperature between about 700 to 800° C., at a thickness between about 80 to 250 Angstroms, using tetraethylorthosilicate, (TEOS), as a source. This is schematically shown in FIG. 2.

Figure 3:
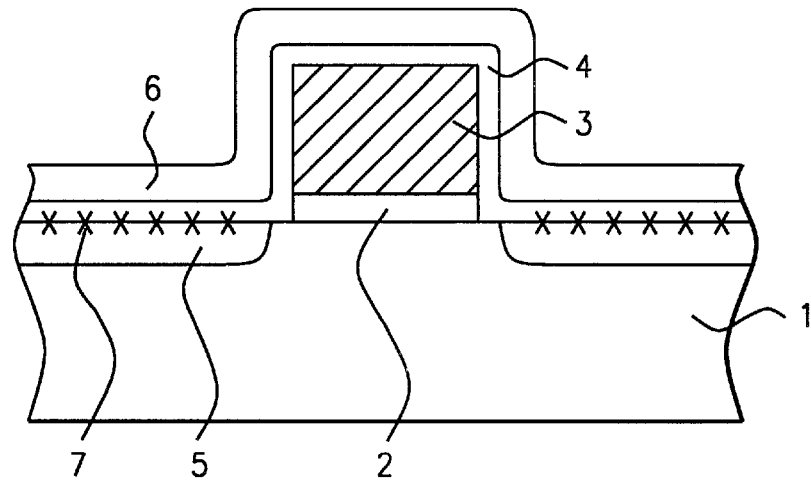

Another photoresist shape is used to protect the core devices from a critical implantation of nitrogen, ($N_2^+$), or nitrogen ions, ($N^+$), performed at an energy between about 5 to 25 KeV, at a dose between about 1E14 to 1E15 atoms/cm$^2$, resulting in a concentration of nitrogen ions 7, located at the top surface of LDD region 5. This is schematically shown in FIG. 3. This plantation procedure results in a pile-up of nitrogen at the LDD—oxide interface, reducing hot carrier electron, (HCE), injection, during operation of the completed I/O NMOS device. In addition the nitrogen pile-up, at this interface increase the transient enhanced diffusion, (TED), phenomena, allowing a more graded IL)D region to be achieved, when compared to counterparts fabricated without the nitrogen implantation procedure. Graded LDD region 5, in combination with the nitrogen pile-up at the interface, also reduces HCE injection. The photoresist shape, used to protect the core devices from the nitrogen implantation procedure, is again removed via plasma oxygen ashing and careful wet cleans.

Figure 4:
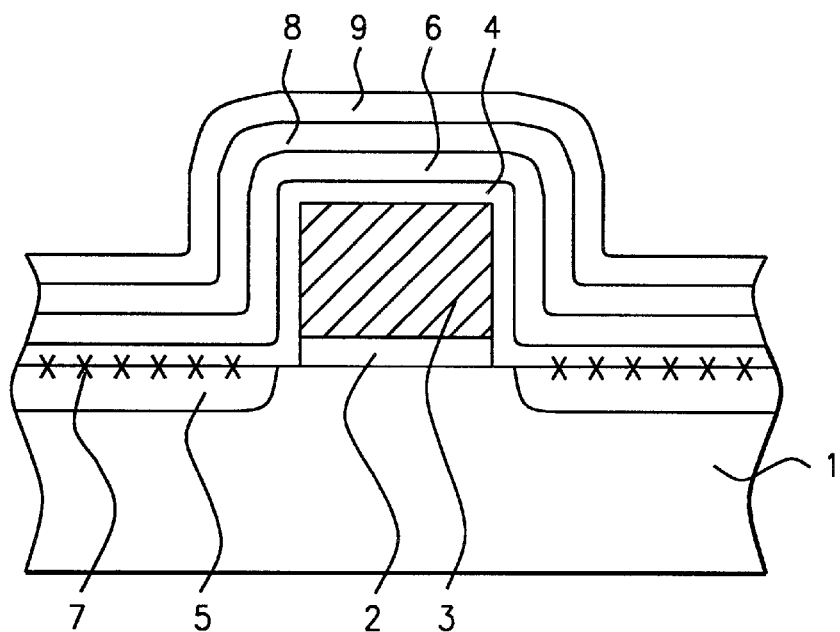
Figure 5:
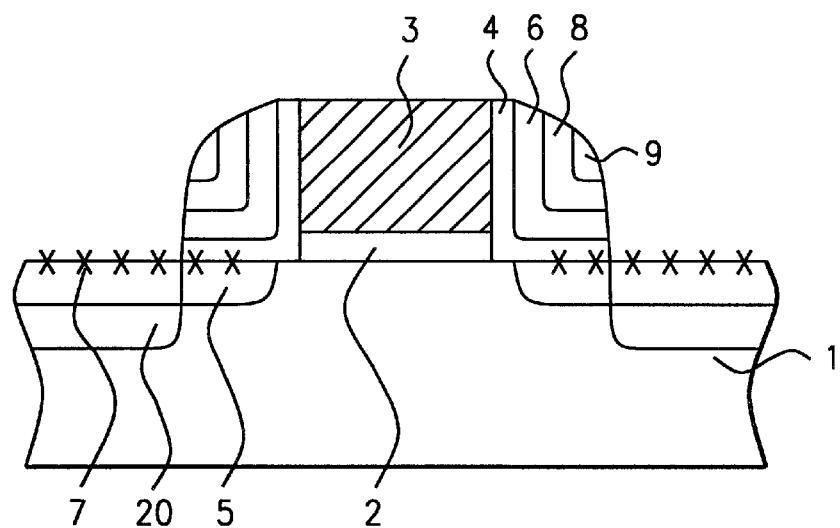

Composite insulator spacers are next formed, and schematically described using FIGS. 4–5. Silicon nitride layer 8, is first obtained, via LPCVD or PECVD procedures, at a temperature between about 700 to 780° C., at a thickness between about 200 to 400 Angstroms. This is followed by the deposition of silicon oxide layer 9, again via LPCVD or PECVD procedures, at a temperature between about 700 to 800° C., to a thickness between about 850 to 1100 Angstroms, using TEOS as a source. Anisotropic RIE procedures, using $CHF_3$ as an etchant for silicon oxide layer 9, and using $Cl_2$ as an etchant for silicon nitride layer 8, are employed to form the composite insulator spacers, shown schematically in FIG. 5. An overetch cycle, for the definition of the composite insulator spacers result in removal the exposed regions of TEOS finer 6, and of silicon oxide layer 4. Heavily doped source/drain region 20, is next formed in regions of the semiconductor substrate not covered by polysilicon gate structure 3, or by the composite spacers, on the sides of the polysilicon gate structure. Heavily dopes source/drain region 20, shown schematically in FIG. 5, is formed via implantation of arsenic, or phosphorous ions, at an energy between about 40 to 60 KeV, at a dose between about 3E15 to 6.5E15 atoms/cm$^2$. A rapid thermal anneal, (RTA), procedure, performed at a temperature between about 1000 to 1050° C., for a time between about 5 to 15 sec, in a nitrogen or argon ambient, is used to activate the dopants in heavily doped source/drain region 20, as well as grading the profile of LDD region 5.

Figure 6:
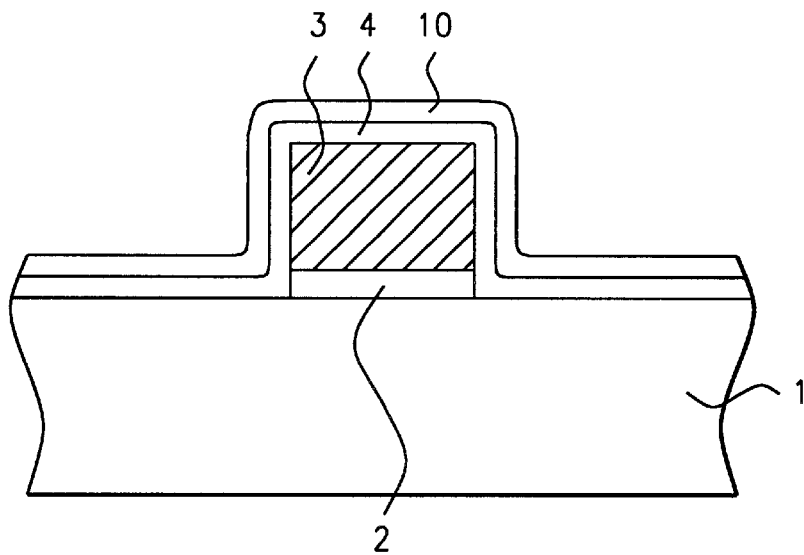
FIGS. 6–7, which schematically, in cross-sectional style, describe a second iteration of this invention, featuring the use of nitrogen, implanted into a top surface of a I/O NMOS, LDD region, prior to the deposition of a TEOS liner layer, however saving a photoresist masking step by in situ implanting the dopants for the LDD region, and nitrogen.
Figure 7:
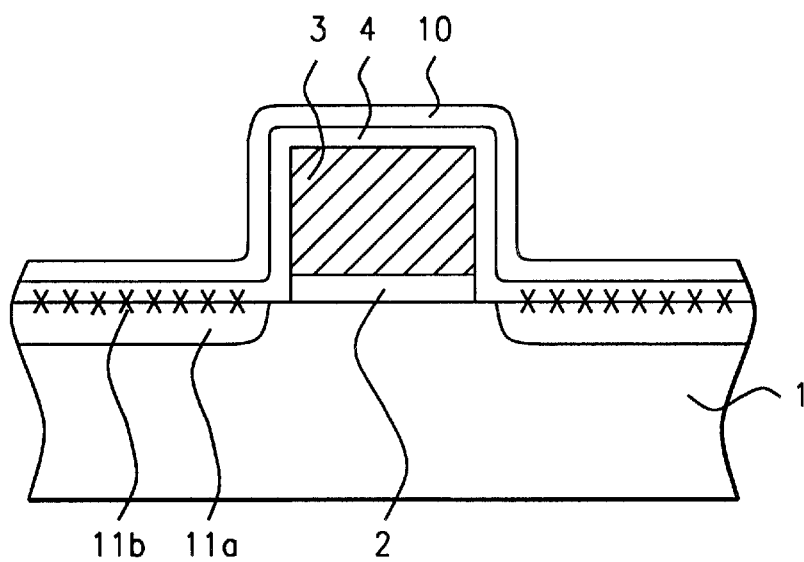

A second iteration of this invention also features the desired nitrogen pile-up, at the LDD-oxide interface, reducing HCE injection, however this iteration features the implantation of the I/O NMOS LDD regions, followed by an in situ implantation of nitrogen, using only one photoresist mask, thus reducing cost. After definition of polysilicon gate structure 3, followed by the re-oxidation procedure, resulting in the formation of silicon oxide layer 4, a TEOS liner layer 10, is deposited, via PECVD or LPCVD procedures, at a thickness between about 80 to 250 Angstroms. This is schematically shown in FIG. 6. A photoresist shape is then formed to protect the core devices from an ion implantation procedure used to form LDD region 11a, and from an in situ ion implantation procedure, used to form nitrogen region 11b. This is schematically shown in FIG. 7. LDD region 11a, and nitrogen region 11b, are formed using identical ion implantation species and conditions used to form LDD region 5, and nitrogen region 7, respectfully, in the first iteration. Composite insulator spacers, and a heavily doped source/drain region, not shown in the drawings, are again formed using materials, and conditions, identical to those used in the first iteration to form heavily doped source/drain region 20, and the composite insulator spacers, comprised of TEOS oxide—silicon nitride. The I/O NMOS device, described in the second iteration, fabricated using one less masking step, then experienced in the first iteration, again results in the desired HCE injection reduction, as a result of the nitrogen implantation procedure. If desired the implantation procedures used for creation of LDD region 11a, and for creation of nitrogen region 11b, can be accomplished prior to deposition of TEOS liner layer 10.

Figure 8:
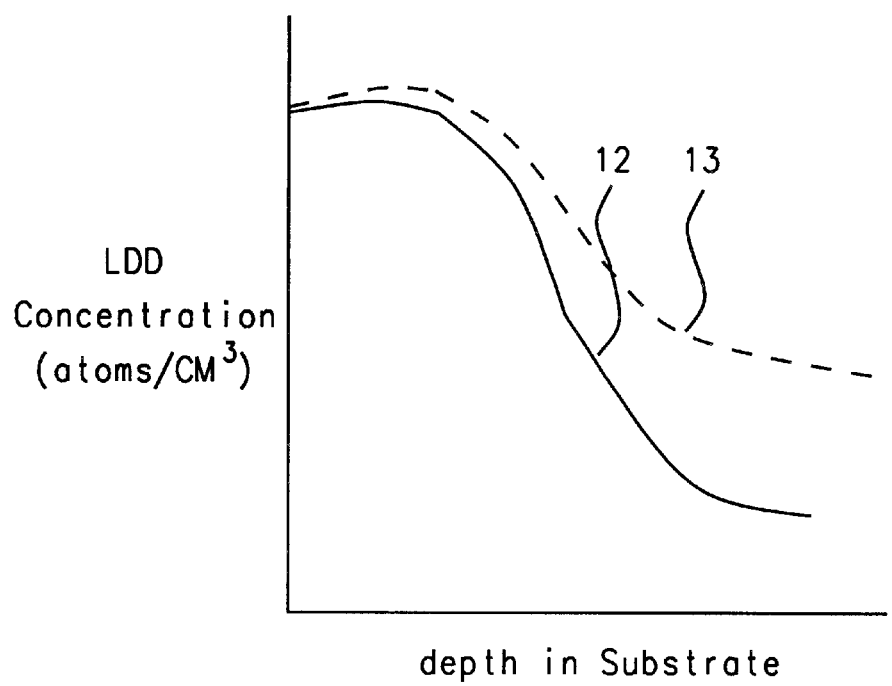
FIG. 8, which compares the profile of LDD region, formed with and without the nitrogen implantation procedure.
Figure 9:
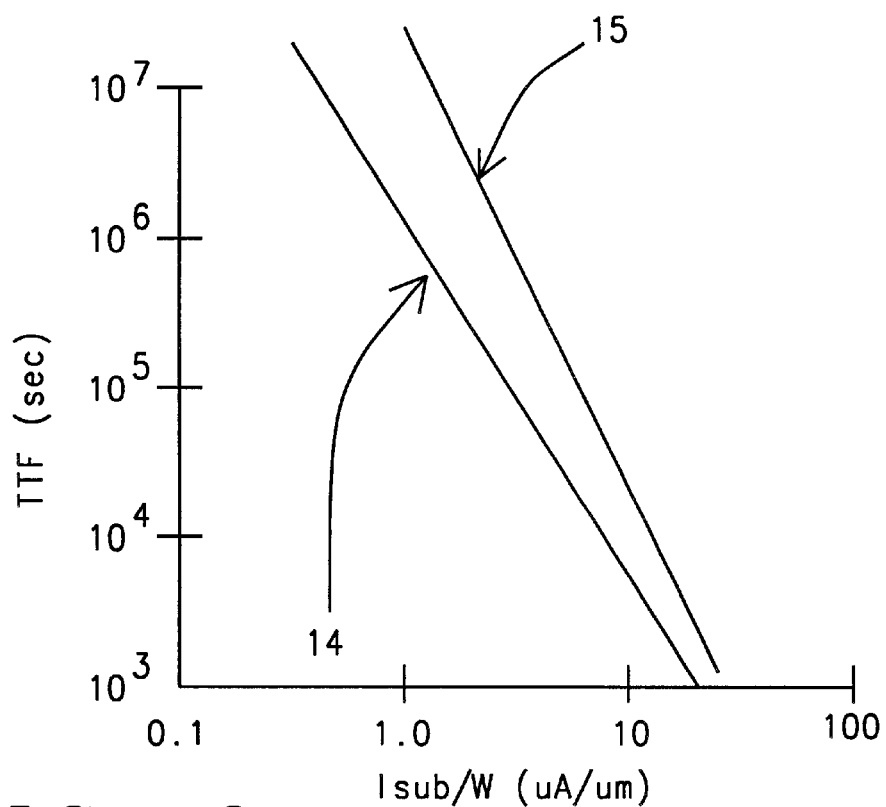
FIG. 9, which graphically describes the substrate current, of I/O NMOS devices, fabricated with, and without the nitrogen implantation procedure, described in this invention.

FIG. 8, graphically represents the dopant profile for LDD region 13, obtained using the nitrogen implantation procedure, featured in the two iterations of this invention. The more graded profile of LDD region 13, compared to counterpart LDD region 12, formed without the nitrogen implantation procedure, resulting from enhanced TED phenomena, will reduce HCE injection. This is shown in FIG. 9, where time to fail, (TTF), influenced by HCE injection, is shown against unwanted substrate current, (Isub), which is in turn generated by HCE injection. The TTF is increased for samples 15, formed using the nitrogen implantation procedure, when compared to samples 14, formed without the nitrogen implantation procedure, featured in this invention. Less substrate current, or less HCE injection is encountered as a result of the nitrogen pile-up, and graded LDD profile, accomplished via the procedures described in this invention.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a metal oxide semiconductor field effect transistor, (MOSFET), device, on a semiconductor substrate, comprising the steps of:

forming a gate structure, overlying a gate insulator layer, on said semiconductor substrate;

growing a first silicon oxide layer on said gate structure, and on the top surface of regions of said semiconductor substrate not covered by said gate structure;

performing a first ion implantation procedure to form a lightly doped source/drain, (LDD), region, in an area of said semiconductor substrate not covered by said gate structure;

depositing a second silicon oxide layer;

performing a second ion implantation procedure to create a nitrogen region at the first silicon oxide-LDD interface;

forming composite insulator spacers on the sides of said gate structure;

performing a third ion implantation procedure to form a heavily doped source/drain region in an area of said semiconductor substrate not covered by said gate structure, or by said composite insulator spacers; and performing an anneal procedure.

2. The method of claim 1, wherein said MOSFET device is an input/output N channel, (I/O NMOS), device.

3. The method of claim 1, wherein said gate insulator layer is a silicon dioxide layer, thermally grown to a thickness between about 40 to 80 Angstroms, at a temperature between about 650 to 900° C., in an oxygen-steam ambient.

4. The method of claim 1, wherein said gate structure is a polysilicon gate structure, comprised from a polysilicon layer which is obtained via LPCVD procedures, at a thickness between about 1500 to 2500 Angstroms, and either doped in situ, during deposition, via the addition of arsine, or phosphine, to a silane ambient, or deposited intrinsically then doped via implantation of arsenic, or phosphorous ions.

5. The method of claim 1, wherein said gate structure is defined via an anisotropic RIE procedure, applied to a polysilicon layer, using $Cl_2$ or $SF_6$ as an etchant.

6. The method of claim 1, wherein said first silicon oxide layer is thermally grown to a thickness between about 15 to 80 Angstroms, at a temperature between about 800 to 1015° C., in an oxygen-steam ambient.

7. The method of claim 1, wherein said first ion implantation procedure, used to form said LDD region, is performed using arsenic or phosphorous ions, at an energy between about 20 to 50 KeV, at a dose between about 2E13 to 5E13 atoms/$cm^2$.

8. The method of claim 1, wherein said second silicon oxide layer, is obtained via LPCVD or PECVD procedures, at a thickness between about 80 to 250 Angstroms, using tetraethylorthosilicate, (TEOS), as a source.

9. The method of claim 1, wherein said second ion implantation procedure, used to create said nitrogen region, is performed using either nitrogen, $N_2^+$), or nitrogen ions, ($N^+$), as a source, at an energy between about 5 to 25 KeV, at a dose between about 1E14 to 1E15 atoms/$cm^2$.

10. The method of claim 1, wherein said composite insulator spacers are comprised of an underlying silicon nitride layer, obtained via LPCVD or PECVD procedures, at a thickness between about 200 to 400 Angstroms, and comprised of an overlying silicon oxide layer, obtained via LPCVD or PECVD procedures, at a thickness between about 850 to 1100 Angstroms, using TEOS as a source.

11. The method of claim 1, wherein said composite insulator spacers are defined via an anisotropic RIE procedure using $CHF_3$ as an etchant for silicon oxide, and using $Cl_2$ as an etchant for silicon nitride.

12. The method of claim 1, wherein said third ion implantation procedure, used to create said heavily doped source/drain region, is performed using arsenic or phosphorous ions, at an energy between about 40 to 60 KeV, at a dose between about 3E15 to 6.5E15 atoms/$cm^2$.

13. The method of claim 1, wherein said anneal procedure is a rapid thermal anneal, (RTA), procedure, performed at a temperature between about 1000 to 1050° C., for a time between about 5 to 15 sec, in a nitrogen or argon ambient.

14. A method of fabricating an input/output N channel, (I/O NMOS), device, on a semiconductor substrate, featuring an implanted nitrogen region, located at an interface of an overlying insulator layer and an underlying, lightly doped source/drain, (LDD), region, comprising the steps of:

growing a silicon dioxde gate insulator layer on said semiconductor substrate;

forming a polysilicon gate structure on said silicon dioxide gate insulator layer;

growing a silicon oxide layer on the surface of said polysilicon gate structure, and on the surface of portions of said semiconductor substrate not covered by said polysilicon gate structure;

using tetraethylorthosilicate as a source to deposit a TEOS silicon oxide liner layer;

performing a first ion implantation procedure to form an N type LDD region in an area of said semiconductor substrate not covered by said polysilicon gate structure;

performing a second ion implantation procedure in situ, to form said nitrogen region at said silicon oxide-N type ULDD interface;

forming composite insulator spacers on sides of said polysilicon gate structure, comprised of an overlying silicon oxide shape, and an underlying silicon nitride shape;

performing a third ion implantation procedure to form an N type, heavily doped source/drain region, in an area of said semiconductor substrate not covered by said polysilicon gate structure, or by said composite insulator spacers; and performing a rapid thermal anneal, (RTA), procedure.

15. The method of claim 14, wherein said silicon dioxide gate insulator layer is obtained via thermal oxidation procedures, at a temperature between about 650 to 900° C., in an oxygen-steam ambient, to a thickness between about 40 to 80 Angstroms.

16. The method of claim 14 wherein said polysilicon gate structure is comprised from a polysilicon layer, which is obtained via LPCVD procedures, at a thickness between about 1500 to 2500 Angstroms, and either doped in situ, during deposition via the addition of arsine, or phosphine, to a silane ambient, or deposited intrinsically the doped via implantation of arsenic, or phosphorous ions, then defined via an anisotropic RIE procedure, applied to a polysilicon layer, using $Cl_2$ or $SF_6$ as an etchant.

17. The method of claim 14, wherein said silicon oxide layer is obtained via thermal oxidation procedures, at a temperature between about 800 to 1015° C., in an oxygen-steam ambient, to a thickness between about 15 to 80 Angstroms.

18. The method of claim 14, wherein said TEOS silicon oxide liner layer is deposited to a thickness between about 80 to 250 Angstroms, via LPCVD or PECVD procedures, using tetraethylorthosilicate, (TEOS), as a source.

19. The method of claim 14, wherein said first ion implantation procedure, used to form said N type LDD region, is performed using arsenic or phosphorous ions, at an energy between about 20 to 50 KeV, at a dose between about 2E13 to 5E13 atoms/cm².

20. The method of claim 14, wherein said second ion implantation procedure, used to create said nitrogen region, is performed using either nitrogen, ($N_2^+$), or nitrogen ions, ($N^+$), as a source, at an energy between about 5 to 25 KeV, at a dose between about 1E14 to 1E15 atoms/cm².

21. The method of claim 14, wherein said composite insulator spacers are comprised of an underlying silicon nitride layer, obtained via LPCVD or PECVD procedures, at a thickness between about 200 to 400 Angstroms, and comprised of an overlying silicon oxide layer, obtained via LPCVD or PECVD procedures, at a thickness between about 850 to 1100 Angstroms, using TEOS as a source.

22. The method of claim 14, wherein said third ion implantation procedure, used to create said N type, heavily doped source/drain region, is performed using arsenic or phosphorous ions, at an energy between about 40 to 60 KeV, at a dose between about 3E15 to 6.5E15 atoms/cm².

23. The method of claim 14, wherein said rapid thermal anneal procedure is performed at a temperature between about 1000 to 1050° C., for a time between about 5 to 15 sec, in a nitrogen or argon ambient.

* * * * *